United States Patent [19]

Urakami

[11] Patent Number: 5,274,651
[45] Date of Patent: Dec. 28, 1993

[54] OPTICAL MODULATOR WITH NONLINEAR MEDIUM DISPOSED INTERIORLY OF LASER RESONATOR

[75] Inventor: Tsuneyuki Urakami, Hamamatsu, Japan

[73] Assignee: Hamamatsu Photonics K.K., Shizuoka, Japan

[21] Appl. No.: 826,061

[22] Filed: Jan. 27, 1992

[30] Foreign Application Priority Data

Jan. 25, 1991 [JP] Japan .................... 3-025770

[51] Int. Cl.⁵ .............................................. H01S 3/10
[52] U.S. Cl. ............................. 372/21; 372/22; 359/328
[58] Field of Search .............. 372/21, 22; 385/122; 359/325, 326, 327, 328, 279, 241

[56] References Cited

U.S. PATENT DOCUMENTS

| | | | |
|---|---|---|---|
| 4,588,957 | 5/1986 | Balant et al. | 359/341 |
| 4,709,417 | 11/1987 | Kuwabara | 372/32 |
| 4,791,631 | 12/1988 | Baumert et al. | 372/22 |
| 4,879,723 | 11/1989 | Dixon et al. | 372/21 |
| 4,884,276 | 11/1989 | Dixon et al. | 372/21 |
| 4,884,277 | 11/1989 | Anthon et al. | 372/22 |
| 4,953,166 | 8/1990 | Mooradian | 372/21 |
| 5,015,054 | 5/1991 | Chaffee | 372/21 |
| 5,097,471 | 3/1992 | Negus et al. | 372/18 |
| 5,128,948 | 7/1992 | Papuchon et al. | 372/21 |
| 5,136,599 | 8/1992 | Wilcox | 372/26 |

FOREIGN PATENT DOCUMENTS 2553204 4/1985 France .
8500472 1/1985 PCT Int'l Appl. .
9002429 3/1990 PCT Int'l Appl. .

OTHER PUBLICATIONS

Laser Research, "Phase Modulation of Ultrashort Laser Pulses", vol. 17, No. 3, Oct. 4, 1988, Jimbo et al., pp. 3-11.
Applied Optics, vol. 26, No. 17, Sep. 1987, pp. 3491-3492, Alfano et al., "Cross phase modulation measured in optical fibers".
Revue de Physique Appliquee, pp. 1677-1694, vol. 22, Dec. 1987, Baldeck et al., "Effects of self, induced and crossphase modulations on the generation of picosecond and femtosecond white light supercontinua".

Primary Examiner—Frank Gonzalez
Attorney, Agent, or Firm—Sughrue, Mion, Zinn, Macpeak & Seas

[57] ABSTRACT

An optical modulator which can perform optical modulation without using pulses having a high level peak power, include a medium having a nonlinear refractive index disposed interiorly of a laser resonator which includes an input mirror, an output mirror, a laser medium disposed between the input and output mirrors, and an excitation device for exciting the laser medium so that a laser pulse is oscillated by the laser medium. The optical modulator can operate in both the self phase modulation mode and the induced-phase modulation mode. To operate the optical modulator in the self phase modulation mode, the laser pulses passing through the medium are self phase modulated. To operate the optical modulator in the induced-phase modulation mode, a light emitting device is provided which emits a light to be modulated. The light is incident on the input mirror and passed through the medium so that the light is cross phase modulated by the laser serving as a pumping light.

18 Claims, 6 Drawing Sheets

OPTICAL MODULATOR WITH NONLINEAR MEDIUM DISPOSED INTERIORLY OF LASER RESONATOR

BACKGROUND OF THE INVENTION

1. Field of the Invention

The present invention relates to an optical modulator wherein a light is modulated in a space within a laser resonator to attain the light modulation with good efficiency.

2. Description of the Prior Art

Intense, ultrafast, and broad-spectral-width pulses close to white-light called continuum or supercontinuum are generated by passing picosecond laser pulses through a nonlinear optical medium having a nonlinear refractive index.

For spectral broadening, it has been known to utilize a phase modulation wherein the spectral range of the laser is broadened when the laser pulse passes through a nonlinear optical medium. As the laser pulse passes through the medium, it causes a refractive index change. This in turn induces a phase change which causes a frequency sweep within the pulse envelope. This process is called self phase modulation (SPM). There are other processes known as induced phase modulation (IPM) and cross phase modulation (XPM). In IPM, a phase modulation for the laser pulses are performed by the aid of an intense laser pulse serving as pumping light. More specifically, when a weak pulse of a different frequency passes through the medium whose refractive index was changed by an intense laser pulse, the phase of the weak optical field can be modulated by the time variation of the index of refraction originating from the primary intense pulse. In XPM, stimulated Raman scattering, harmonic generation and four photon parametric generation induced by an excited light pulse generate a light whose wavelength is different from the wavelength of the excited light, resulting in generation of a spectral broadened light having a spectrum around the frequency of the excited light. Through the use of such processes, the spectrum of the laser pulse can be broadened.

According to SPM, an amount of phase modulation is dependent on light intensity of the incident light, so that it is necessary to introduce a large peak power laser to effectively broaden the spectrum. According to IMP or XPM, while it is not required that the light to be modulated be of a large peak power, it is necessary that the pumping light be of a large peak power. There is a problem that a high modulation efficiency is not attainable in an optical modulation utilizing a nonlinear effect, because the modulation efficiency is dependent on the peak power of the light.

SUMMARY OF THE INVENTION

An object of the present invention is to provide an optical modulator which can effectively perform an optical modulation without using pulses having a high level peak power.

To achieve the above and other objects, there is provided an optical modulator wherein a medium having a nonlinear refractive index is disposed interiorly of a laser resonator. The laser resonator includes an input mirror, an output mirror, a laser medium disposed between the input and output mirrors, and exciting means for exciting the laser medium so that a laser pulse is oscillated by the laser medium.

The optical modulator can operate in both self phase modulation mode and induced-phase modulation mode. To operate the optical modulator in the self phase modulation mode, the laser pulses passing through the medium are self phase modulated. To operate the optical modulator in the induced-phase modulation mode, a light emitting device is provided which emits a light to be modulated. The light is incident on the input mirror and passed through the medium so that the probe light is subjected to induced-phase modulation by the laser pulse serving as a pumping light.

Laser power in the interior of the laser resonator is much stronger than the power of the laser derived outwardly of the laser resonator. Therefore, the light is effectively modulated by the nonlinear medium disposed interiorly of the laser resonator.

A plurality of nonlinear media, may be used, each to achieve different purposes. For example, an intensity modulation or high harmonic generations are accomplished by applying an electric filed thereto to change the reflective index.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

Figure 1:
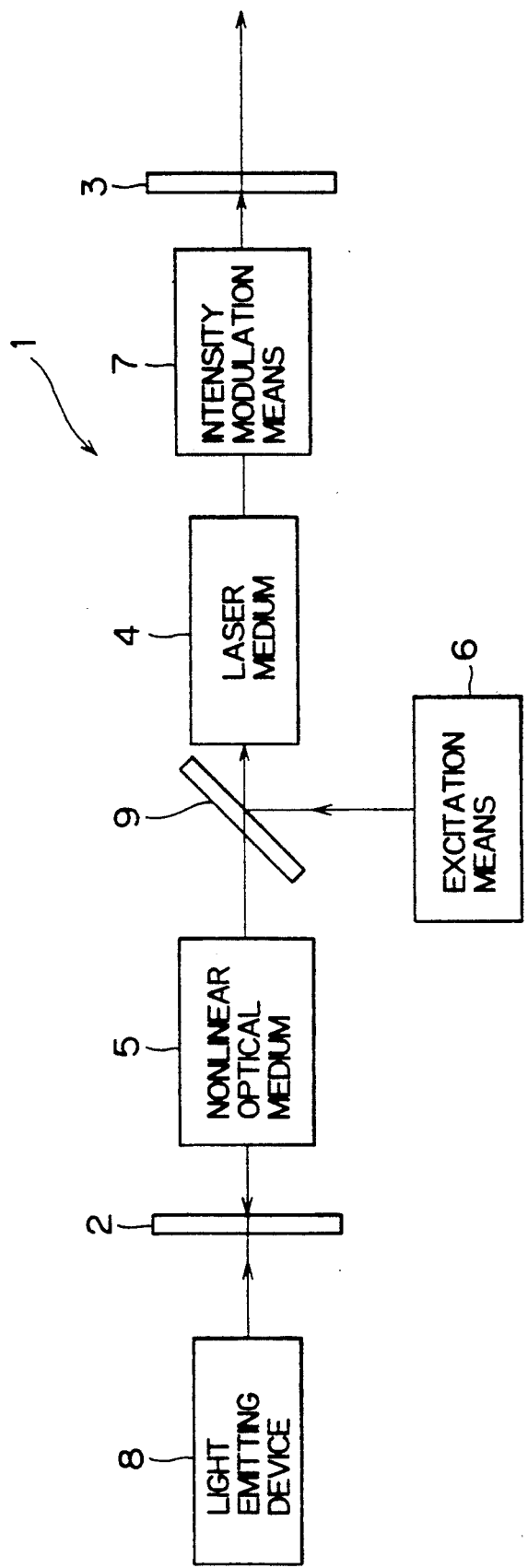
FIG. 1 is an explanatory diagram showing an optical modulator according to a first embodiment of the present invention.

A first embodiment of the present invention will be described with reference to FIG. 1.

A laser resonator 1 is basically made up of an input mirror 2, an output mirror 3, a laser medium 4, and an excitation means 6 for exciting the laser medium 4. A nonlinear optical medium 5 whose refractive index changes when laser pulses pass therethrough is disposed interiorly of the laser resonator 1 on the longitudinal axis thereof. An intensity modulation means 7 may optionally be disposed interiorly of the laser resonator 1.

With such an arrangement, the light to be modulated is subjected to light modulation with the nonlinear optical medium 5 disposed inside the laser resonator 1, to thereby broaden the spectrum.

The input mirror 2 allows to pass the light to be modulated therethrough but rejects the transmission of the laser pulses oscillated in the laser resonator 1. The output mirror 3 allows the modulated light to pass therethrough but rejects the transmission of the laser pulses oscillated in the laser resonator 1.

Semiconductor, solid, liquid and gaseous materials are usable for the laser medium 4. Typically, semiconductor materials, such as GaAs, InGaAsP, InAlP, solid materials, such as Nd-YAG, YLF, $Cr^{3+}:Mg_2SiO_4$, $Cr^{4+}:Mg_2SiO_4$, and fibers, liquid materials, such as Rhodamine6G, gaseous materials, such as argon, excimer, $CO_2$, on copper vapor, are used.

The excitation means 6 is a light source which excites the laser medium 4. Discharge excitation, current excitation, or chemical reaction excitation are available for the excitation means 6, which are selected depending upon the materials of the laser medium 4 used. An optical excitation will be taken as an example in the following description.

In the illustrated embodiment, a dichroic mirror 9 is arranged for introducing a pumping light in parallel to an optical axis. The dichroic mirror 9 has a high reflectivity against the excited laser light wavelength and a high transmissivity for the wavelength of the light to be modulated. It is to be noted that the dichroic mirror 9 can be dispensed with when the pumping light is incident in a direction orthogonal to the optical axis.

The nonlinear optical medium 5 is selected from the materials having a nonlinear refractive index. Such materials include, for example, hydrogen, water ($H_2O$, $D_2O$), acetone, cyclohexanone, nitrogen, oxygen, nitrobenzene, toluene, chlorobenzene, bromobenzene, benzene, $CS_2$, $CCl_4$, diamond, calcite, silicon, rock crystal, $LiTaO_3$, $LiNbO_3$, and InSb.

The intensity modulation means 7 can be selected from a Q-switch, cavity dumper, mode rocker, and passive mode locking owing to a saturable absorption dye. For the laser medium 4 made of a semiconductor material, the intensity modulation means 7 can be dispensed with by using a pulsating excitation current.

For the Q-switch constituted with an A/O element or E/O element, the laser medium 4 is excited under the condition where the Q factor is lowered, and then the Q level is abruptly increased when the reverse distribution density has become sufficiently large, to thereby obtain an intense, ultrashort duration laser light output.

For the cavity dumper used for the intensity modulation means 7, the laser light output is pulsated while instantaneously taking out the energy stored in the interior of the laser resonator 1 through diffraction.

For the mode rocker used for the intensity modulation means 7, an A/O element or E/O element is incorporated in the interior of the laser resonator 1 to forcibly synchronize the phases of a plurality of simultaneously oscillating longitudinal modes using an electrical signal applied externally.

When the intensity modulation means 7 is operating in the passive mode locking by the use of an absorbable dye, the absorbable dye absorbs the weak light to thereby further weaken the light but absorbs little of the intense light and such light remains substantially the same.

It should be noted that the excitation means 6 can double as the intensity modulation means 7. Specifically, in the case of light excitation, the excitation means 6 pulsates the excited light, and in the case of current excitation, the excitation is performed by a pulsating current. A hybrid arrangement in which these excitation means 6 are combined can be adopted.

The optical modulator 1 shown in FIG. 1 can operate in both self phase modulation mode and induced-phase modulation mode. To operate the optical modulator 1 in the self phase modulation mode, the oscillated laser pulses passing through the nonlinear optical medium 5 are self phase modulated. In this case, the output mirror 3 partially passes the oscillated laser wavelength to derive the output therefrom.

To operate the optical modulator in the induced-phase modulation mode, a light emitting device 8 is provided which emits a light to be modulated. The light is incident on the input mirror 2 and passed through the medium 5 so that the light is subjected to induced-phase modulation by the laser light serving as a pumping light.

More specifically, the laser medium 4 of the laser resonator 1 is excited by the excitation light from the excitation means 6 and a pulse oscillation occurs by virtue of the intensity modulation means 7 disposed within the laser resonator 1. Under the condition that the pulse oscillation is taking place in the laser resonator 1, the probe light emitted from the probe light emitting device 8 is applied to the input mirror 2. In the interior of the nonlinear optical medium 5, the refractive index changes when the laser pulses oscillated in the laser resonator 1 pass therethrough. Accordingly, when the laser pulses and the probe light are superposedly propagating through the nonlinear optical medium 5, the probe light is subjected to phase modulation and the phase modulated light, i.e., frequency broadened light, is derived from the output mirror 3.

In the arrangement shown in FIG. 1, with the provision of a wavelength dispersion correcting mechanism, such as a grating pair, in the interior of the laser resonator 1, the peak power of the laser pulse oscillating in the laser resonator 1 can be increased, whereby modulation efficiency can be improved and the modulated light can be formed into an ultrashort pulsation. Further, it is possible to vary the pulse duration.

A second embodiment of the present invention will be described with reference to FIG. 2.

Figure 2:
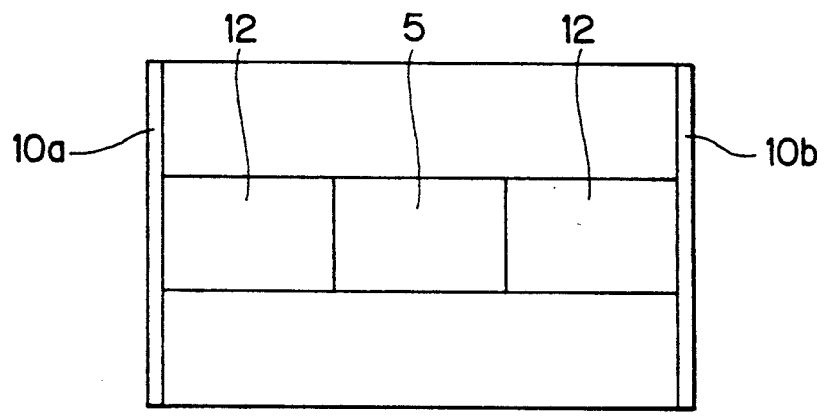
FIG. 2 is an explanatory diagram showing an optical modulator according to a second embodiment of the present invention.

FIG. 2 shows an arrangement of an optical modulator in the form of a semiconductor laser, in which a nonlinear optical region 5 having a nonlinear refractive index is partially formed in an active layer 12. Both sides of the optical modulator are formed with coatings 10a, 10b by evaporation, which coatings have a high reflectivity against the oscillating wavelength of the semiconductor laser but have a high transmissivity for the wavelength of the light to be modulated.

In this arrangement, when the semiconductor laser is driven with short duration pulses, a pulse oscillation occurs in the laser resonator 1. A light to be modulated is incident on the optical modulator from a light emitting device as shown in FIG. 1 through the coating 10a, the light is subjected to phase modulation in the nonlinear optical region 5, whereby modulated light is derived outwardly from the coating 10b.

In the second embodiment, current pulses generated when a high frequency current is applied to a comb generator can be used as a current source for exciting the semiconductor laser. While in the illustrated embodiment, the coatings 10a, 10b are evaporated on the side surfaces of the optical modulator, the arrangement can be modified so that the side surfaces are coated with non-reflective coatings and input and output mirrors are disposed outside of the semiconductor laser as in the first embodiment.

A third embodiment of the present invention will be described with reference to FIGS. 3 and 4.

Figure 3:
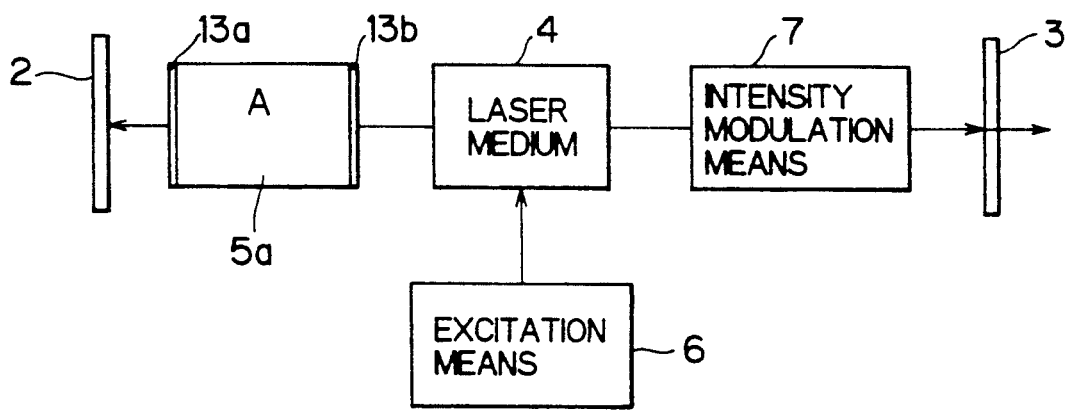
FIG. 3 is an explanatory diagram showing an optical modulator according to a third embodiment of the present invention.

The arrangement shown in FIG. 3 is substantially the same as that shown in FIG. 1. However, in the arrangement of FIG. 3, both sides of the nonlinear optical medium 5a are formed with masks 13a, 13b which form a prism-shaped laser transmissive region as shown in FIG. 4.

In this arrangement, oscillation takes place in the interior of the laser resonator 1 similar to the first embodiment shown in FIG. 1. The third embodiment differs from the first embodiment in that with the provision of the masks 13a, 13b in both sides of the nonlinear optical medium 5a, the cross-sectional pattern of the laser light oscillating in the interior of the laser resonator 1 is in the form of a prism.

Figure 4:
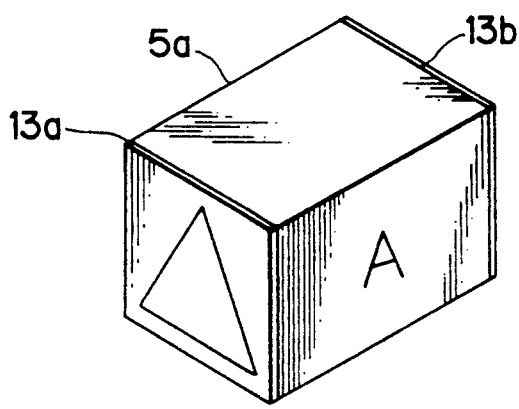
FIG. 4 is a perspective view showing a masked nonlinear medium for the third embodiment of the present invention.

If a light to be modulated is incident on the medium 5a from the surface A indicated in FIG. 4, that is, from the surface of the nonlinear optical medium 5a intersecting the optical axis of the laser resonator 1, the refractive index of the prism-shaped region of the nonlinear optical medium 5a changes only when the laser pulses propagate through the medium 5, so that the light modulation can be achieved in synchronism with the laser pulses oscillating in the laser resonator 1.

In the third embodiment, the masks 13a, 13b may not be prism-shaped but can be configured to various shapes. By configuring the masks 13a, 13b into a lens shape, convergence of the modulated light can be achieved in synchronism with the laser pulses. Further, the positions of the nonlinear medium 5a having the masks 13a, 13b are not limited to those illustrated in FIG. 3 but may be positioned anywhere in the interior of the laser resonator 1.

FIG. 5-8 show respective modification of the optical modulator wherein a wavelength converting device 11, such as a parametric wavelength converter, a second harmonic generator (SHG) 12, a third harmonic generator (THG) 13, and, a fourth harmonic generator (FHG) 14, are provided in the interior of the laser resonator 1.

Figure 5:
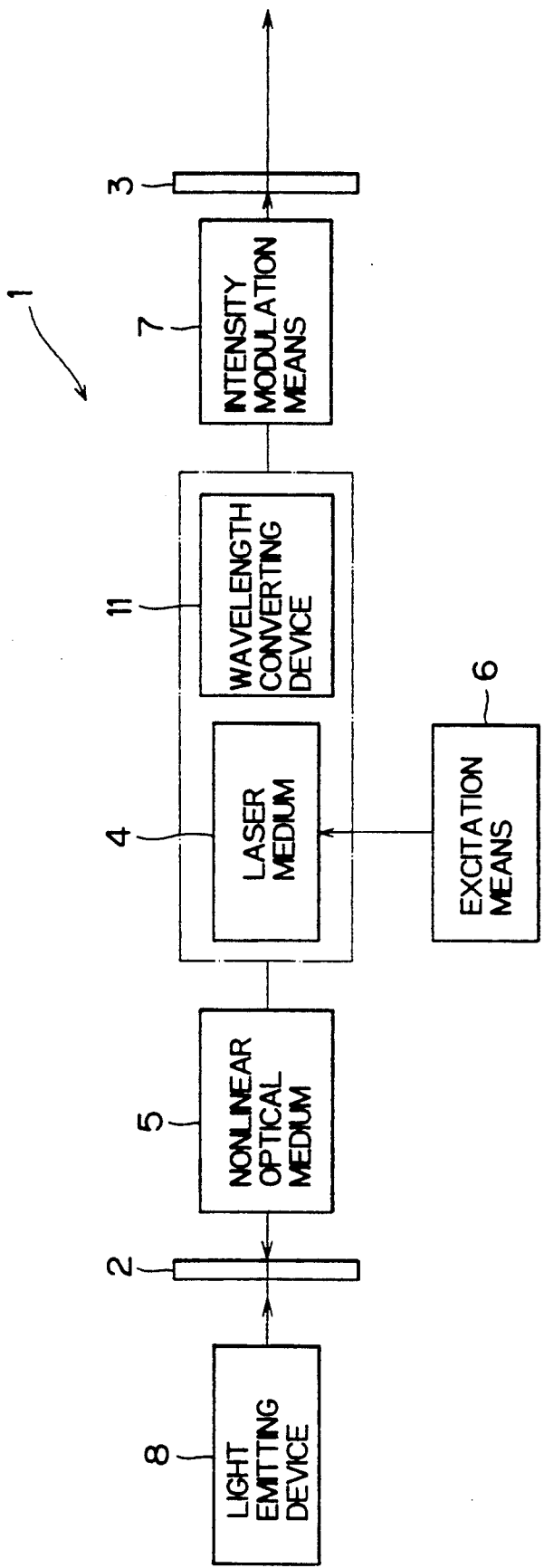
FIG. 5 is an explanatory diagram showing an optical modulator according to a fourth embodiment of the present invention.
Figure 6:
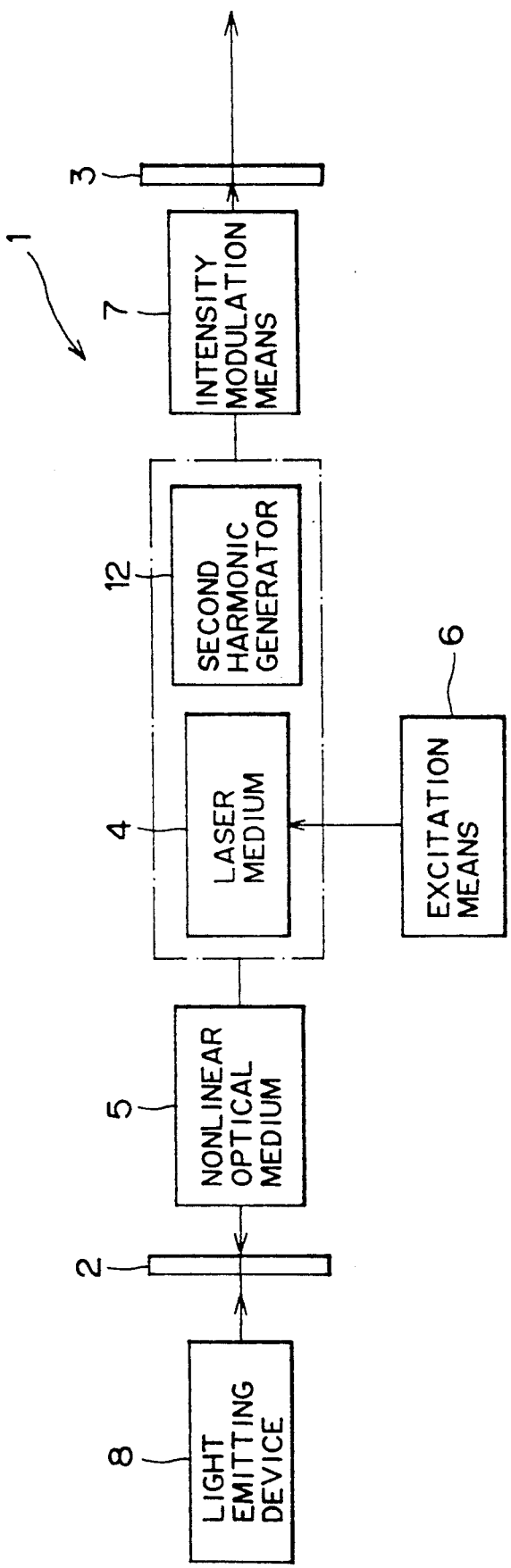
FIG. 6 is similar to FIG. 5, but includes a second harmonic generator 12 in place of the wavelength converting device 11 in FIG. 5.
Figure 7:
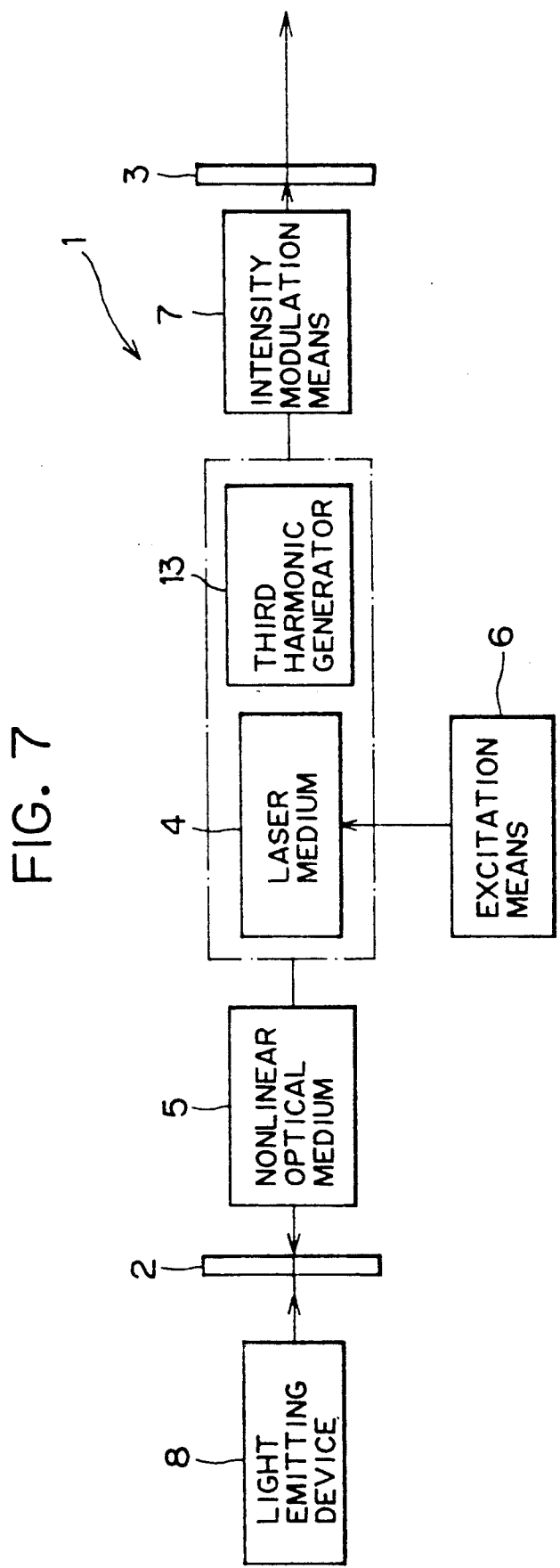
FIG. 7 is similar to FIG. 5, but includes a third harmonic generator 13 in place of the wavelength converting device 11 in FIG. 5.
Figure 8:
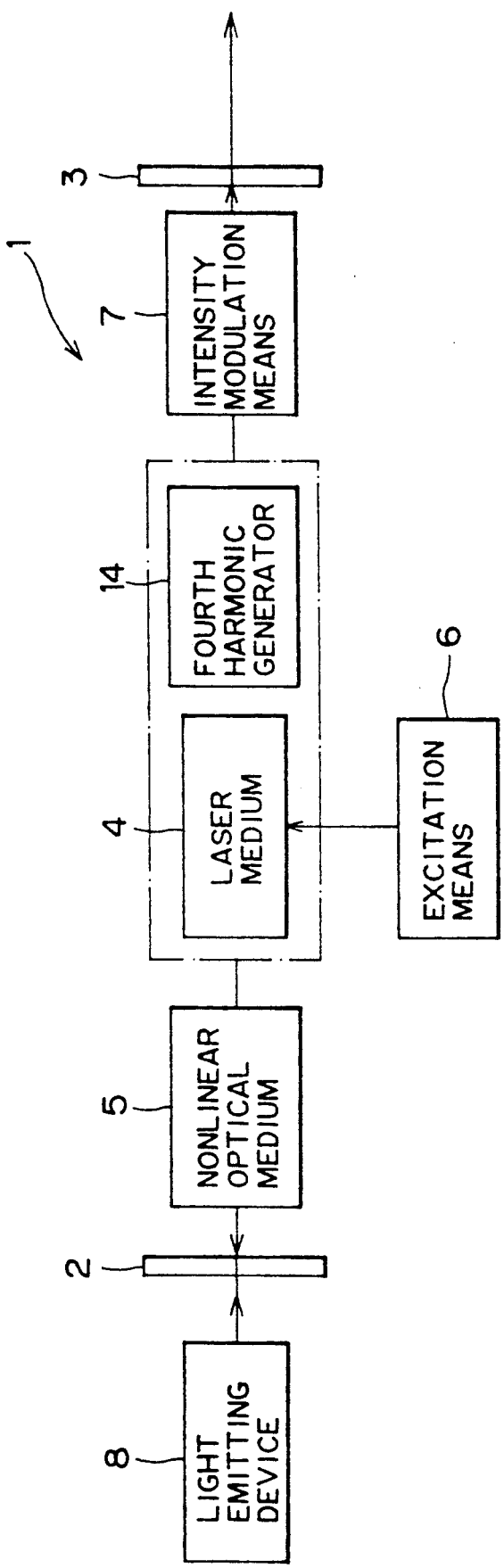
FIG. 8 is similar to FIG. 5, but includes a fourth harmonic generator 14 in place of the wavelength converting device 11 in FIG. 5.

In the arrangements of FIGS. 1 and 5, modifications can be made so as to provide a wavelength selection device either internally or externally of the laser resonator 1. With such an arrangement, the wavelength can be converted to fall in an extensive range. Further, in the foregoing embodiments, a plurality of nonlinear optical media may be provided.

With the present invention arranged as described above, the light to be modulated and the pumping light are not required to be of a large power peak, yet the light may be modulated with good efficiency. When the optical modulator is operated in IPM or XPM, it is advantageous in that the wavelength of the light can be varied to fall in a desired range by selecting the wavelength of the probe light as desired.

What is claimed is:

1. An optical modulator for modulating light, comprising:
a laser resonator including a first mirror, a second mirror, a laser medium disposed between said first and second mirrors, and means for exciting said laser medium so that laser pulses are oscillated by said laser resonator; and
at least one nonlinear refractive index medium, disposed interiorly of said laser resonator, and disposed to pass light to be modulated for modulating the light, said second mirror comprising means for receiving modulated light from said nonlinear refractive index medium and for outputting modulated light.

2. An optical modulator according to claim 1, wherein said exciting means excites said laser medium so as to oscillate said laser pulses.

3. An optical modulator according to claim 2, wherein said nonlinear refractive index medium is disposed to pass the laser pulses therethrough so that the laser pulses are self phase modulated.

4. An optical modulator according to claim 1, further comprising means disposed interiorly of said laser resonator for receiving laser pulses from said laser medium and for intensity modulating the laser pulses, said intensity modulating means passing the intensity modulated laser pulses therethrough.

5. An optical modulator according to claim 4, wherein said nonlinear refractive index medium is disposed to pass on intensity modulated laser pulse therethrough so that the intensity modulated laser is self phase modulated.

6. An optical modulator according to claim 1, further comprising at least one of a second harmonic generator, a third harmonic generator, a fourth harmonic generator, and a wavelength converting device positioned interiorly of the laser resonator to receive light from said laser medium and to output light to said second mirror.

7. The optical modulator according to claim 1, further comprising means for emitting a light to be modulated, the light being incident on said first mirror and passed through said nonlinear medium such that the light is subjected to induced-phase modulation by the laser pulses, wherein said nonlinear medium is disposed to pass the laser pulses therethrough such that the laser pulses are self-phase modulated.

8. An optical modulator according to claim 1, further comprising a dichroic mirror positioned in the laser resonator for introducing pumping light in parallel to an optical axis of said light to be modulated, said dichroic mirror being positioned in the optical axis of said light to be modulated.

9. An optical modulator according to claim 1, further comprising means for emitting light to be modulated, said light to be modulated being incident on said first mirror and passing through said nonlinear medium, such that said light to be modulated produced by said light emitting means and said laser pulses produced by said excitation means exciting said laser medium superposedly propagate through said nonlinear medium.

10. An optical modulator according to claim 1, wherein said nonlinear refractive index medium further includes means for receiving the light to be modulated and for converging the light to be modulated in synchronism with the laser pulses oscillating in the laser resonator.

11. An optical modulator according to claim 10, wherein said converging means comprises masks positioned on first and second ends of said nonlinear medium.

12. An optical modulator for modulating light, comprising:

a laser resonator including a first mirror, a second mirror, a laser medium disposed between said first and second mirrors, and means for exciting said laser medium so that a laser pulse is oscillated by said laser resonator;

at least one nonlinear refractive index medium disposed interiorly of said laser resonator for modulating light, said second mirror comprising means for outputting modulated light; and means for emitting light to be modulated, the light being incident on said first mirror and passing through said nonlinear refractive index medium so that the light is subjected to induced-phase modulation by the laser resonator.

13. An optical modulator according to claim 12, wherein said exciting means excites said laser medium so as to oscillate laser pulses.

14. An optical modulator according to claim 12, further comprising means disposed interiorly of said laser resonator for receiving laser pulses from said laser medium and for intensity modulating the laser pulses, said intensity modulating means passing the intensity modulated laser pulses therethrough.

15. An optical modulator for modulating light, comprising:
a laser resonator including a first mirror, a second mirror, a laser medium disposed between said first and second mirrors, and means for exciting said laser medium so that a laser pulse is oscillated by said laser resonator; and at least one nonlinear refractive index medium disposed interiorly of said laser resonator for modulating light, said second mirror comprising means for outputting modulated light, wherein said nonlinear refractive index medium has first and second opposing surfaces on which masks are partially formed to thereby form a region in said nonlinear refractive index medium through which the laser pulse passes.

16. An optical modulator for modulating light, comprising:
a semiconductor laser including an active semiconductor layer, and means for exciting said active semiconductor layer so that laser light is oscillated by said active semiconductor layer;

a nonlinear refractive index medium partially formed in said active semiconductor layer for modulating light; and means for outputting the light modulated by said nonlinear refractive index medium.

17. An optical modulator according to claim 16, further comprising means for emitting a light to be modulated, the light being incident on said active semiconductor layer and passing therethrough so that the light is subjected to induced-phase modulation by the laser light.

18. An optical modulator according to claim 17, wherein said semiconductor laser has first and second opposing surfaces on which coatings are formed, the coatings passing light emitted by said light emitting means but preventing the laser light from passing therethrough.

* * * * *